(12) United States Patent
Hasumi et al.

(10) Patent No.: US 9,702,515 B2
(45) Date of Patent: Jul. 11, 2017

(54) LIGHT-EMITTING DEVICE AND METHOD FOR COMPENSATING CHROMATICITY OF LIGHT-EMITTING DEVICE

(71) Applicants: CITIZEN ELECTRONICS CO., LTD., Yamanashi (JP); CITIZEN WATCH CO., LTD., Tokyo (JP)

(72) Inventors: Yuichi Hasumi, Tokyo (JP); Nodoka Oyamada, Yamanashi (JP)

(73) Assignees: CITIZEN WATCH CO., LTD., Tokyo (JP); CITIZEN ELECTRONICS CO., LTD., Yamanashi (JP)

( * ) Notice: Subject to any disclaimer, the term of this patent is extended or adjusted under 35 U.S.C. 154(b) by 0 days.

(21) Appl. No.: 14/166,444

(22) Filed: Jan. 28, 2014

(65) Prior Publication Data

US 2014/0211463 A1    Jul. 31, 2014

(30) Foreign Application Priority Data

Jan. 29, 2013   (JP) ................. 2013-014258

(51) Int. Cl.
    *F21S 4/00*       (2016.01)
    *F21V 21/00*      (2006.01)
    *F21K 9/64*       (2016.01)

(52) U.S. Cl.
    CPC .................... *F21K 9/64* (2016.08)

(58) Field of Classification Search
    CPC ..... F21K 9/00; F21K 9/50; F21K 9/56; F21K 9/64

USPC ........ 362/230–231, 249.02, 311.02; 315/291
See application file for complete search history.

(56) References Cited

U.S. PATENT DOCUMENTS

| 8,222,652 | B2 * | 7/2012 | Harrah ............. | H05B 33/086 257/89 |
| 8,981,665 | B1 * | 3/2015 | Hamburgen ....... | H05B 33/0872 315/291 |
| 2008/0238335 | A1 * | 10/2008 | Lee .................. | H05B 33/0869 315/294 |
| 2014/0111985 | A1 * | 4/2014 | Harbers ............. | F21V 9/16 362/231 |

FOREIGN PATENT DOCUMENTS

| JP | 2006-135007 A | 5/2006 |
| JP | 2012-113959 A | 6/2012 |

* cited by examiner

*Primary Examiner* — Jason Moon Han

(57) ABSTRACT

An object of the present invention is to provide a light-emitting device having a temperature compensation function implemented with simple circuitry, and a method of temperature compensation in such a light-emitting device. More specifically, the invention provides a light-emitting device and a method of temperature compensation using a light-emitting device, wherein the light-emitting device includes a substrate, a first LED chip which is arranged on the substrate, and which has a characteristic such that $\Delta x$ and $\Delta y$, each representing an amount of displacement on an xy chromaticity diagram, both are negative as temperature rises, and a second LED chip which is arranged on the substrate, and which has a characteristic such that $\Delta x$ and $\Delta y$, each representing an amount of displacement on an xy chromaticity diagram, both are positive as temperature rises.

4 Claims, 9 Drawing Sheets

FIG. 7
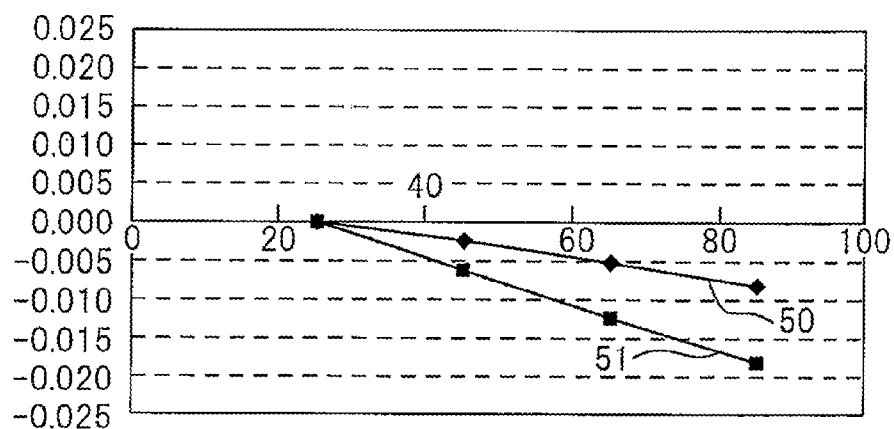
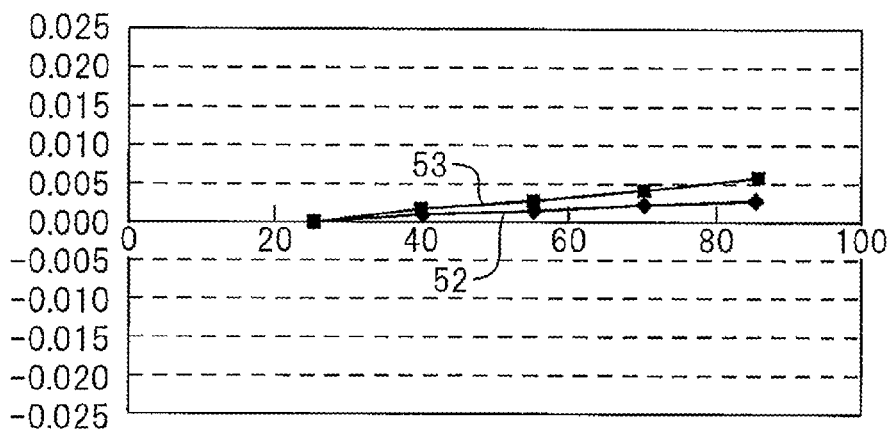
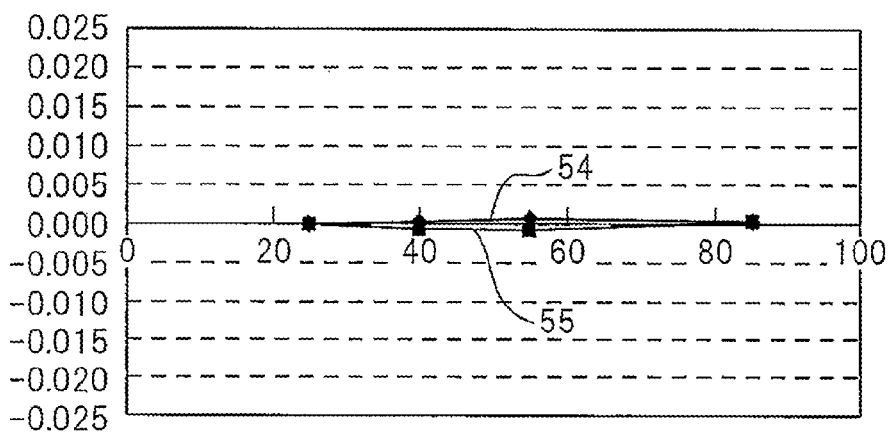

FIG. 9
(a)
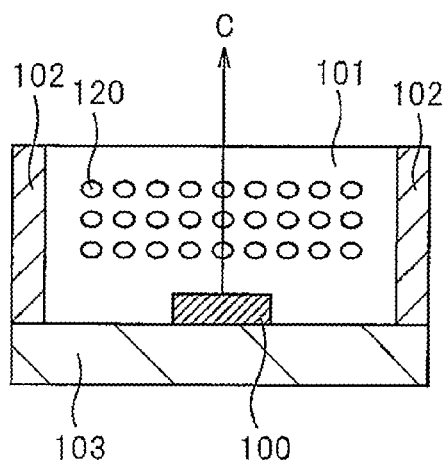
(b)
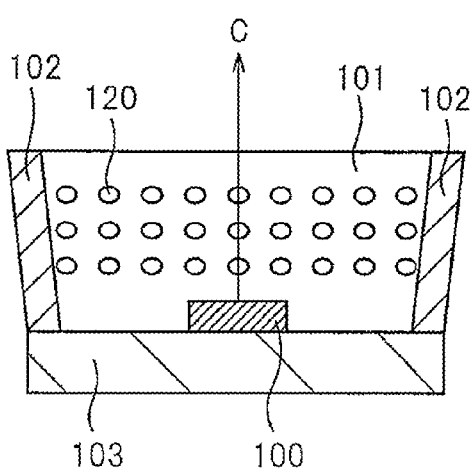
(c)
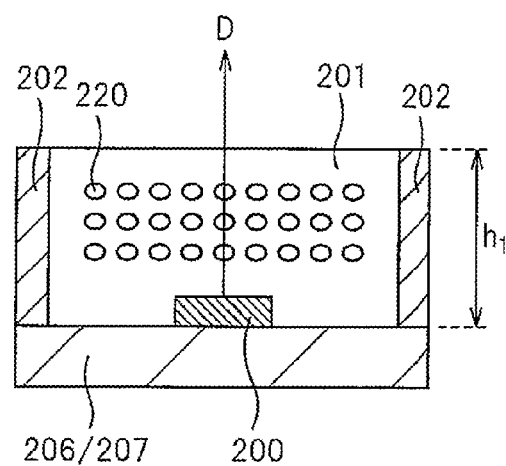
(d)
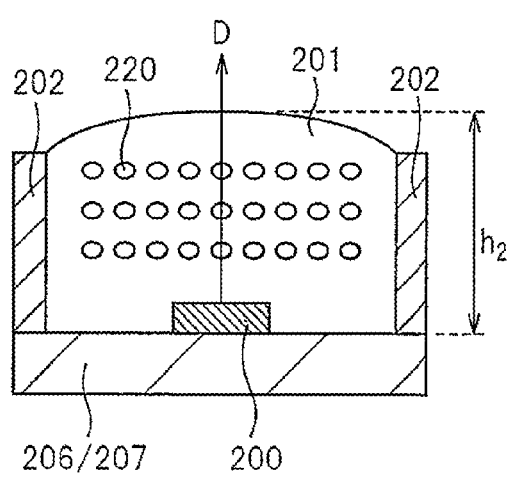

LIGHT-EMITTING DEVICE AND METHOD FOR COMPENSATING CHROMATICITY OF LIGHT-EMITTING DEVICE

CROSS-REFERENCES TO RELATED APPLICATION

This application is a new U.S. patent application that claims benefit of JP2013-014258, filed on Jan. 29, 2013, the entire content of JP2013-014258 is hereby incorporated by reference.

TECHNICAL FIELD

The present invention relates to a light-emitting device and a method for compensating for chromaticity of the light-emitting device.

BACKGROUND

Light-emitting devices are known in which a driver IC for driving light-emitting elements incorporates a temperature compensation circuit so that the light-emission intensity and chromaticity characteristics of many light-emitting elements can be easily maintained constant and uniform despite changes in temperature (for example, refer to Japanese Unexamined Patent Publication No. 2006-135007).

However, the device disclosed in Japanese Unexamined Patent Publication No. 2006-135007 has had the problem that incorporating the temperature compensation circuit in the driver IC makes the circuitry of the driver IC complex, leading to a further increase in cost.

It is known that as long as the amount of light changes within areas close to the chromaticity curve of the black body locus, a natural and balanced light is produced. In view of this, it is known to construct a light-emitting device by combining a plurality of kinds of LEDs whose color temperatures change at different rates according to the applied current, with provisions made so that the output light of the plurality of LEDs as a whole lies close to the chromaticity curve of the black body locus when the light is tuned by adjusting the current applied to the LEDs (for example, refer to Japanese Unexamined Patent Publication No. 2012-113959).

However, in Japanese Unexamined Patent Publication No. 2012-113959, the idea of compensating for changes in color temperature due to changes in device temperature is not disclosed.

In a light-emitting device using an LED, since light is produced by applying current to the LED, the LED is heated due to the application of the current, and its temperature thus changes. Further, the temperature of the LED may also change due to changes in ambient temperature. It is also known that the color temperature of LED output light changes as the temperature of the LED changes.

As a result, when a light-emitting device using such LEDs is applied, for example, as a ceiling lighting apparatus, the chromaticity of the output light of the lighting apparatus changes as the time elapses from the moment it was turned on, and the color appearance becomes different from the color appearance produced immediately after the lighting apparatus was turned on; this can give the user an unnatural feeling. In view of this, attempts have been made to maintain the chromaticity of the LED output light constant by incorporating a temperature compensation circuit as described, for example, in patent document 1.

It is an object of the present invention to provide a light-emitting device having a temperature compensation function implemented with simple circuitry, and a method of temperature compensation in such a light-emitting device.

According to the present invention, there is provided a light-emitting device includes a substrate, a first kind of LED chip which is arranged on the substrate, and which has a characteristic such that $\Delta x$ and $\Delta y$, each representing an amount of displacement on an xy chromaticity diagram, both become negative as temperature rises, and a second kind of LED chip which is arranged on the substrate, and which has a characteristic such that $\Delta x$ and $\Delta y$, each representing an amount of displacement on an xy chromaticity diagram, both are positive as temperature rises.

Preferably, the light-emitting device further includes a current supply terminal for supplying current to the first kind of LED chip and the second kind of LED chip so that chromaticity of light emitted from the light-emitting device stays within a 2-step MacAdam ellipse despite changes in temperature of the light-emitting device.

Preferably, the light-emitting device further includes a diffusing plate.

Preferably, in the light-emitting device, a sealing resin for sealing the first kind of LED chip and a resin frame formed so as to surround the sealing resin are chosen to have the same and/or substantially the same thermal expansion coefficient, and a sealing resin for sealing the second kind of LED chip is chosen to have a thermal expansion coefficient higher than the thermal expansion coefficient of a resin frame formed so as to surround the sealing resin.

According to the present invention, there is also provided a method of chromaticity compensation, includes arranging on the substrate a first kind of LED chip having a characteristic such that $\Delta x$ and $\Delta y$, each representing an amount of displacement on an xy chromaticity diagram, both are negative as temperature rises, arranging on the substrate a second kind of LED chip having a characteristic such that $\Delta x$ and $\Delta y$, each representing an amount of displacement on an xy chromaticity diagram, both are positive as temperature rises, and supplying current to the first kind of LED chip and the second kind of LED chip so that chromaticity of light emitted from the light-emitting device stays within a 2-step MacAdam ellipse despite changes in temperature of the light-emitting device.

Preferably, in the method of chromaticity compensation, a sealing resin for sealing the first kind of LED chip and a resin frame formed so as to surround the sealing resin are chosen to have the same and/or substantially the same thermal expansion coefficient, and a sealing resin for sealing the second kind of LED chip is chosen to have a thermal expansion coefficient lower than the thermal expansion coefficient of a resin frame formed so as to surround the sealing resin.

According to the light-emitting device and the light-emitting device temperature compensation method described above, it is possible to provide a light-emitting device having a temperature compensation function implemented with simple circuitry, and a method of temperature compensation in such a light-emitting device.

Further, according to the light-emitting device and the light-emitting device temperature compensation method described above, since the first kind of LED chip having a characteristic such that $\Delta x$ and $\Delta y$, each representing the amount of displacement on the xy chromaticity diagram, both become negative as temperature rises and the second kind of LED chip having a characteristic such that $\Delta x$ and $\Delta y$, each representing the amount of displacement on the xy chromaticity diagram, both are positive as temperature rises are used in combination to cancel out the temperature shift of the chromaticity, it becomes possible to provide a light-emitting device having a temperature compensation function and a method of temperature compensation without using a special temperature compensation circuit.

BRIEF DESCRIPTION OF THE DRAWINGS

Other features and advantages of the present invention will be apparent from the ensuing description, taken in conjunction with the accompanying drawings, in which:

FIG. 7(a) is a diagram showing the temperature shift of the first kind of LED chip (CL-L270-U1N-A-T), FIG. 7(b) is a diagram showing the temperature shift of the second kind of LED chip (CL-L400-C1N-A-T), and FIG. 7(c) is a diagram showing the temperature shift of a first embodiment;

FIGS. 9(a) to 9(d) are diagrams for explaining the displacement that occurs on the xy chromaticity diagram due to a temperature rise.

DESCRIPTION

A light-emitting device according to the present invention will be described below with reference to the drawings. It will, however, should be noted that the technical scope of the present invention is not limited to any particular embodiment described herein and extends to the inventions described in the appended claims and their equivalents.

Figure 1:
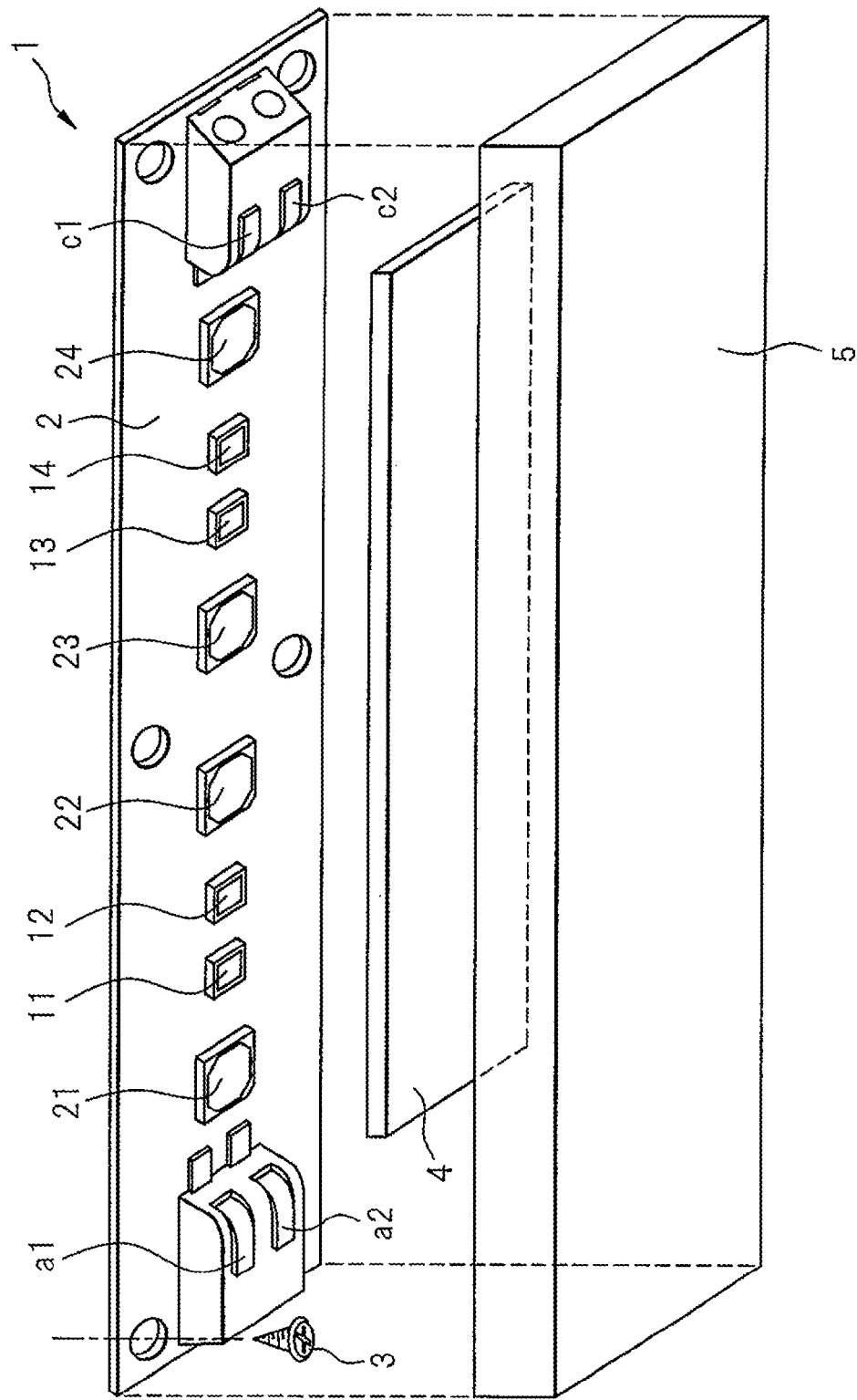
FIG. 1 is an external view of a light-emitting device 1.
Figure 2:
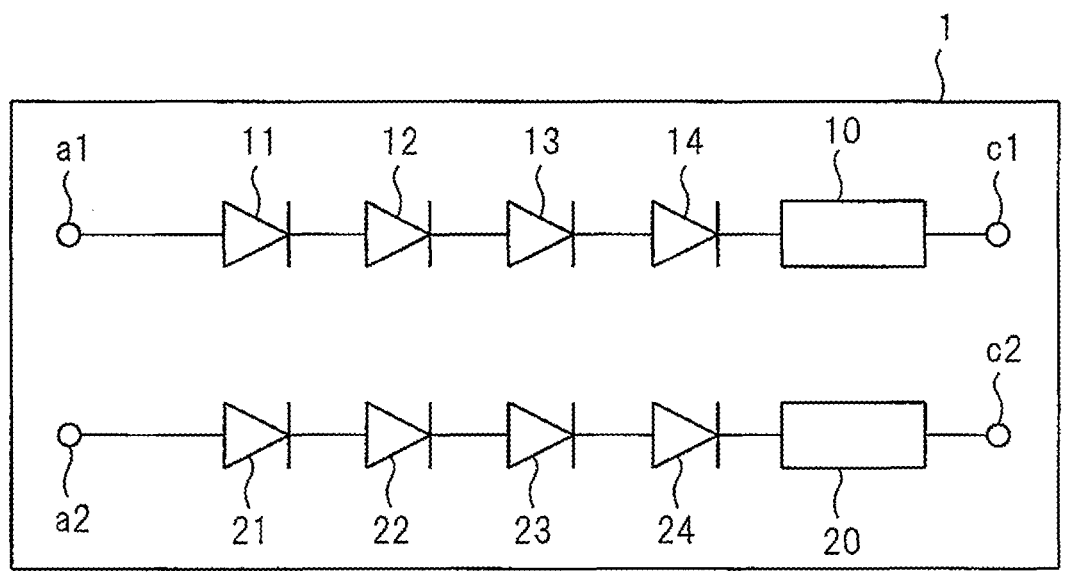
FIG. 2 is a circuit diagram of the light-emitting device 1.

FIG. 1 is an external view of a light-emitting device 1, and FIG. 2 is a circuit diagram of the light-emitting device 1.

The light-emitting device 1 includes LED chips of a first kind, 11, 12, 13, and 14, LED chips of a second kind, 21, 22, 23, and 24, anode electrodes a1 and a2, and cathode electrodes c1 and c2, all mounted on a substrate 2.

The substrate 2 is formed from a metal core base capable of dissipating heat, and is fixed to a heat sink or the like of a lighting apparatus (not shown) by twisting screws 3 into six mounting holes opened in the substrate 2. The substrate 2 may instead be formed from a glass epoxy base or the like.

A diffusing plate 4 and a protective cover 5 formed from a transparent plastic or like material are disposed on the front side, i.e., the light-emitting side, of the light-emitting device 1. The diffusing plate 4 and the protective cover 5 shown here are only examples, and the diffusing plate and the protective cover may be constructed so as to jointly protect a plurality of light-emitting devices 1.

In the light-emitting device 1, the two different kinds of LEDs are respectively connected in series between the anode electrodes and the cathode electrodes. Further, current limiting means (devices) 10 and 20 such as limiting resistors, connected in series with the respective kinds of LEDs, are disposed between the anode electrodes and the cathode electrodes. If a current-controlled LED driving means is connected to each kind of LEDs connected in series, then the current limiting means (devices) 10 and 20 need not be provided. The anode electrodes a1 and a2 and the cathode electrodes c1 and c2 are connected to a current supply circuit of the lighting apparatus (not shown).

Figure 3:
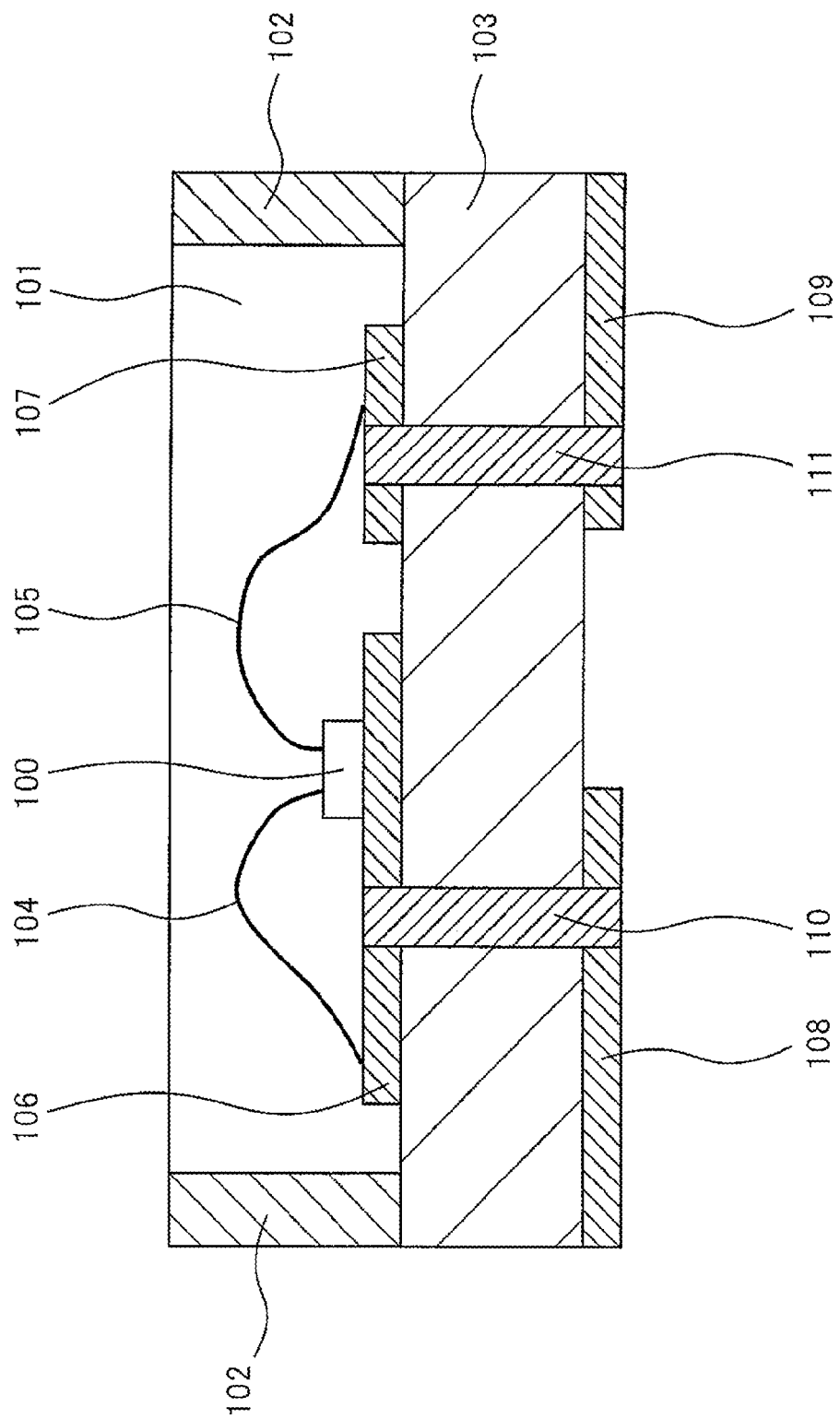
FIG. 3 is a cross-sectional view of a CL-L270-U1N-A-T.

FIG. 3 is a cross-sectional view of a CL-L270-U1N-A-T.

LED chips manufactured by Citizen Electronics under the model name CL-L270-U1N-A-T ($V_F$=3.1 V when $I_F$=60 mA) can be used as the first kind of LED chips 11, 12, 13, and 14. The three-dimensional shape of CL-L270-U1N-A-T is the same as that shown in FIG. 1 for the first kind of LED chips 11, 12, 13, and 14.

As shown in FIG. 3, in the CL-L270-U1N-A-T, an LED die 100 mounted on a glass epoxy resin substrate 103 is encapsulated with an optically transmissive silicone-based sealing resin 101. A white resin frame 102 is formed so as to surround the sealing resin 101. The sealing resin 101 contains yttrium aluminum garnet (YAG)-based phosphors activated with cerium, and the blue light from the LED die 100 is combined with the yellow light from the phosphors to produce pseudo-white light as will be described later. Preferably, the thermal expansion coefficient of the sealing resin 101 is in the range of 150 to 300 ppm/° C., and the thermal expansion coefficient of the white resin frame 101 is also in the range of 150 to 300 ppm/° C. In the CL-L270-U1N-A-T, the thermal expansion coefficient of the sealing resin 101 and the thermal expansion coefficient of the white resin frame 101 are both set so as to fall within the above preferable range and are chosen to have substantially the same value.

The LED die 100 is connected via two wires 104 and 105 to first electrode pads 106 and 107, respectively, on the resin substrate 103. The first electrode pads 106 and 107 are electrically connected to second electrode pads 108 and 109, respectively, by means of vias 110 and 111 formed through the resin substrate 103. The CL-L270-U1N-A-T is connected via the second electrode pads 108 and 109 to the electrodes (not shown) formed on the substrate 2.

Figure 4:
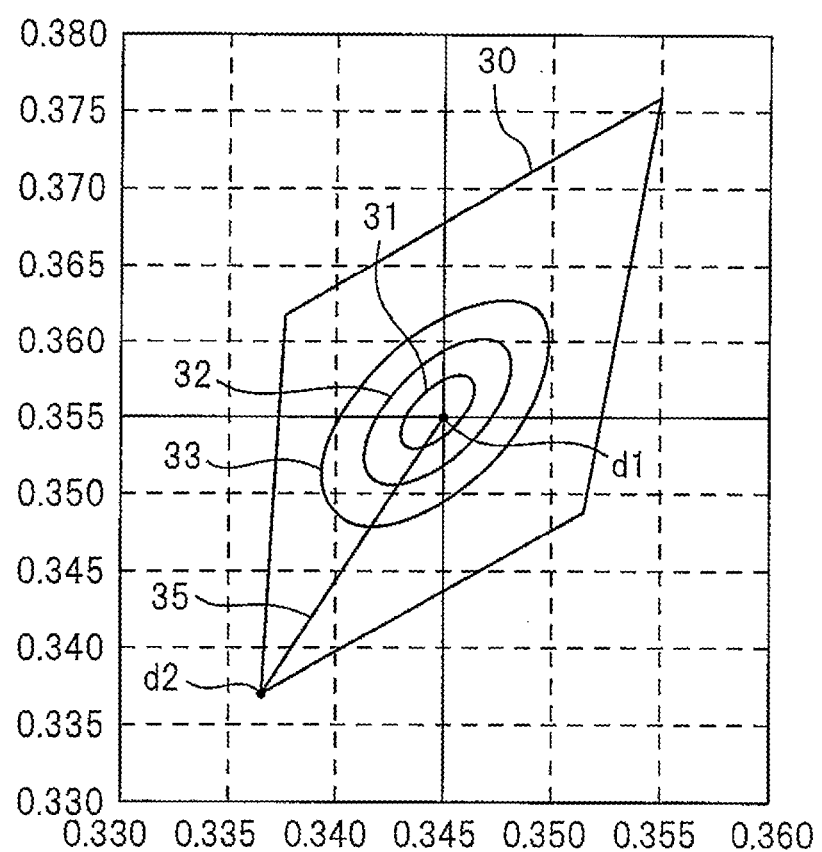
FIG. 4 is an xy chromaticity diagram showing an example of the characteristic of a first kind of LED chip.

FIG. 4 is an xy chromaticity diagram showing an example of the characteristic of the first kind of LED chip.

FIG. 4 shows chromaticity shifts in the CIE xy chromaticity diagram (color temperature: 5000K) for the first kind of LED chip. A quadrilateral 30 defines the chromaticity range of the first kind of LED chip; a small circle 31 defines the range of a 1-step MacAdam ellipse, a medium-sized circle 32 defines the range of a 2-step MacAdam ellipse, and a large circle defines the range of a 3-step MacAdam ellipse.

The MacAdam ellipses were derived from experiments of visual perception conducted by David Lewis MacAdam, and are set based on the standard deviation of perception variation relative to a specific color at the center on the xy chromaticity diagram. According to the experiments conducted by MacAdam, three times the standard deviation (i.e., 3-step) corresponds to the threshold of perception. That is, if the change of chromaticity extends beyond the 3-step MacAdam ellipse, the possibility of the chromaticity being perceived as having changed increases. In other words, as long as the change of chromaticity stays within the range of the 2-step MacAdam ellipse (the medium-sized circle 32), the possibility of the chromaticity being perceived as having changed is small, and if it stays within the range of the 1-step MacAdam ellipse (the small circle 31), the possibility of the chromaticity being perceived as having changed is extremely small. The MacAdam ellipses are specified based on ANSI C78.377 defined by ANSI (American National Standards Institute).

In FIG. 4, a locus 35 indicates the locus of the temperature shift of the chromaticity of the first LED chip whose chromaticity at temperature Tc=25° C. is indicated at d1: the chromaticity at temperature Tc=85° C. is indicated at d2. In this way, the first LED chip has the characteristic that the displacement Δx along the x axis and the displacement Δy along the y axis both are negative as the temperature rises.

As can be understood from FIG. 4, as the temperature of the first kind of LED chip rises, a temperature shift occurs in the chromaticity of the first LED chip, eventually exceeding the range of the 3-step MacAdam ellipse (the large circle 33), and the possibility of the chromaticity being perceived as having changed increases. That is, if the lighting apparatus is constructed using only the first kind of LED chip and is continuously lit, the LED temperature rises due to the continuous lighting, and the chromaticity of the output light of the lighting apparatus may be perceived as having changed.

Figure 5:
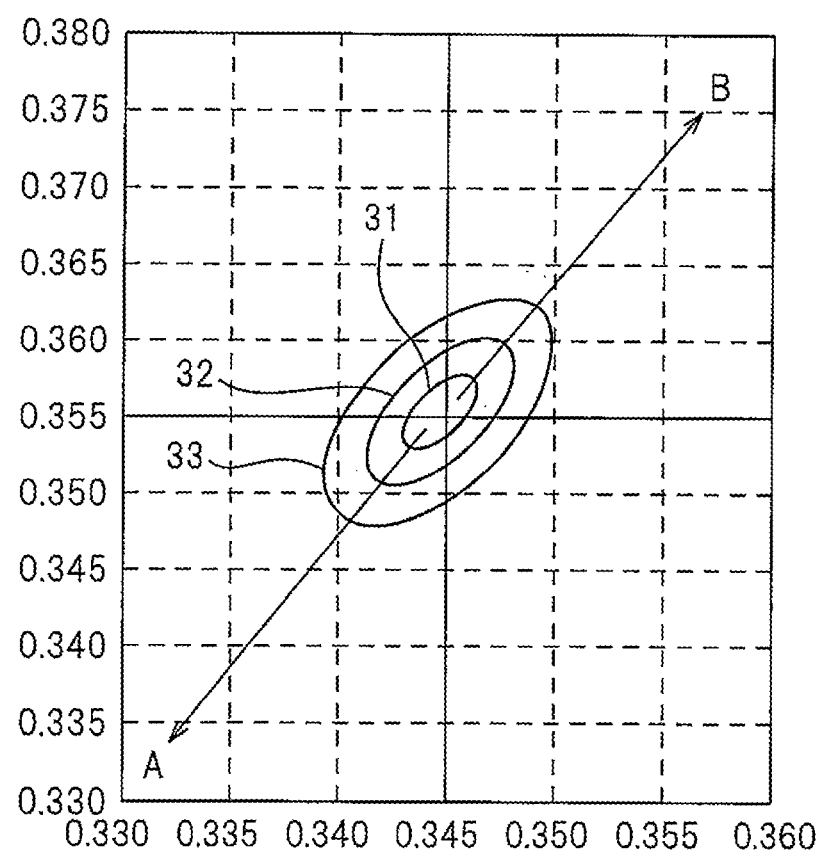
FIG. 5 is a diagram for explaining the characteristic required of a second kind of LED chip.

FIG. 5 is a diagram for explaining the characteristic required of the second kind of LED chip.

FIG. 5 shows the CIE xy chromaticity diagram, in which arrow A indicates the direction of the temperature shift of the first kind of LED chip. As in FIG. 4, the small circle 31, the medium-sized circle 32, and the large circle 33 define the range of the 1-step MacAdam ellipse, the range of the 2-step MacAdam ellipse, and the range of the 3-step MacAdam ellipse, respectively.

In the light-emitting device 1, since the direction of the temperature shift of the first kind of LED chip is negative as indicated by arrow A (Δx and Δy are both negative), the second kind of LED chip is chosen to exhibit a temperature shift in the direction of arrow B (Δx and Δy are both positive). As a result, if the chromaticity changes due to the temperature change of the two kinds of LED chips, the change of the chromaticity stays at least within the range of the 2-step MacAdam ellipse over a predetermined temperature range (for example, Tc=25° C. to 85° C.), since the temperature shift directions cancel each other out.

A light-emitting device (first embodiment) having the same configuration as that of the light-emitting device 1 shown in FIGS. 1 and 2 was fabricated by using CL-L270-U1N-A-T as the first LED chip and CL-L400-C1N-A-T, manufactured by Citizen Electronics, as the second LED chip.

Figure 6:
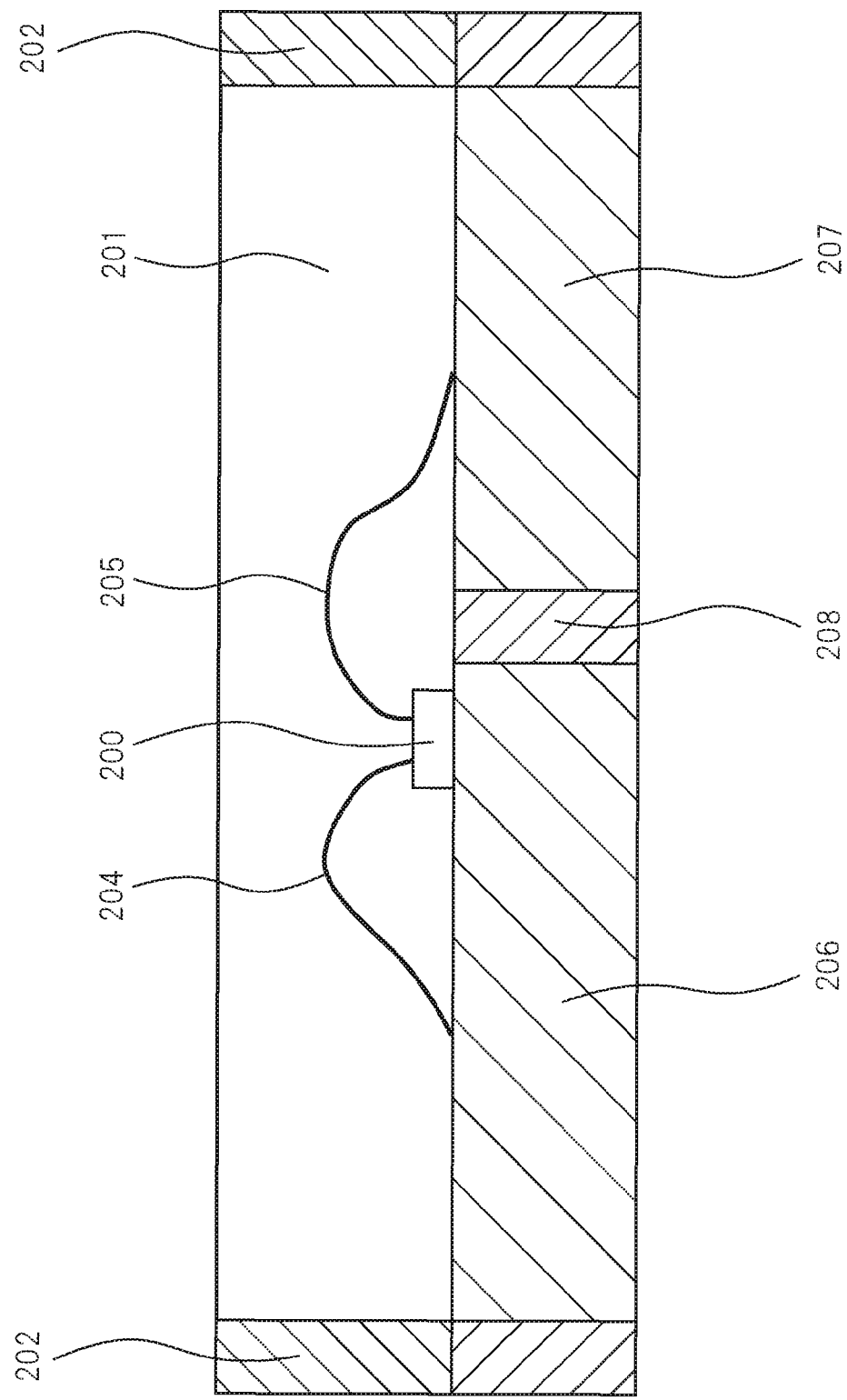
FIG. 6 is a cross-sectional view of a CL-L400-C1N-A-T.

FIG. 6 is a cross-sectional view of the CL-L400-C1N-A-T.

LED chips manufactured by Citizen Electronics under the model name CL-L400-C1N-A-T ($V_F$=3.1 V when $I_F$=180 mA) can be used as the second LED chips 21, 22, 23, and 24. The three-dimensional shape of CL-L400-C1N-A-T is the same as that shown in FIG. 1 for the second LED chips 21, 22, 23, and 24.

As shown in FIG. 6, an LED die 200 is encapsulated with an optically transmissive silicone-based sealing resin 201. A white resin frame 202 is formed so as to surround the sealing resin 201. The sealing resin 201 contains yttrium aluminum garnet (YAG)-based phosphors activated with cerium, and the blue light from the LED die 200 is combined with the yellow light from the phosphors to produce pseudo-white light as will be described later. Preferably, the thermal expansion coefficient of the sealing resin 201 is in the range of 150 to 300 ppm/° C., and the thermal expansion coefficient of the white resin frame 202 is in the range of 10 to 100 ppm/° C.

The LED die 200 is connected via two wires 204 and 205 to electrode pads 206 and 207, respectively. An insulating layer 208 is formed between and around the electrode pads 206 and 207. The CL-L400-C1N-A-T is connected via the electrode pads 206 and 207 to the electrodes (not shown) formed on the substrate 2.

FIG. 7(a) shows the temperature shift of the first kind of LED chip (CL-L270-U1N-A-T), FIG. 7(b) shows the temperature shift of the second kind of LED chip (CL-L400-C1N-A-T), and FIG. 7(c) shows the overall temperature shift of the light-emitting device in the first embodiment. In FIGS. 7(a) to 7(c), the ordinate represents the amount of displacement, Δx and Δy, and the abscissa represents the temperature. The chromaticity was measured in accordance with IES LM-79 by measuring the total luminous flux using an integrated sphere.

In FIG. 7(a), graph 50 shows the amount of displacement, Δx, as a function of the temperature (25° C. to 85° C.) of the first LED chip (CL-L270-U1N-A-T), and graph 51 shows the amount of displacement, Δy, as a function of the temperature (25° C. to 85° C.) of the first kind of LED chip (CL-L270-U1N-A-T). When the values shown in FIG. 7(a) are plotted in the xy chromaticity diagram, the locus 35 shown in FIG. 4 is obtained.

In FIG. 7(b), graph 52 shows the amount of displacement, Δx, as a function of the temperature (25° C. to 85° C.) of the second kind of LED chip (CL-L400-C1N-A-T), and graph 53 shows the amount of displacement, Δy, as a function of the temperature (25° C. to 85° C.) of the second kind of LED chip (CL-L400-C1N-A-T). From FIG. 7(b), it can be understood that the second LED chip has the characteristic that Δx and Δy both are positive as the temperature rises.

FIG. 7(c) shows the values obtained by measuring the chromaticity of the light-emitting device fabricated in the first embodiment; graph 54 shows the amount of displacement, Δx, as a function of the temperature (25° C. to 85° C.), and graph 55 shows the amount of displacement, Δy, as a function of the temperature (25° C. to 85° C.). To measure the chromaticity, the anode electrodes a1 and a2 and cathode electrodes c1 and c2 of the light-emitting device fabricated in the first embodiment were connected to a current supply source not shown, and the setting was made so that a constant current of 60 mA was supplied to the anode a1 and a constant current of 180 mA to the anode a1.

As can be understood from FIGS. 7(a) and 7(b), the slops of Δx and Δy are greater in the case of the first LED chip (CL-L270-U1N-A-T) than in the case of the second LED chip (CL-L400-C1N-A-T). Accordingly, in the first embodiment, the luminous flux of each LED chip was adjusted by adjusting the amount of current so that the chromaticity such as shown in FIG. 7(c) could be obtained when the first LED chip and the second LED chip were mounted on a 1:1 basis. More specifically, when a constant current of 60 mA is supplied to the first kind of LED chip, and a constant current of 180 mA to the second kind of LED chip, the luminous flux of the second kind of LED chip becomes 3.61 times that of the first kind of LED chip. In this condition, the chromaticity was measured by arranging the two kinds of LED chips on a 1:1 basis; the thus measured chromaticity is shown in FIG. 7(c).

Figure 8:
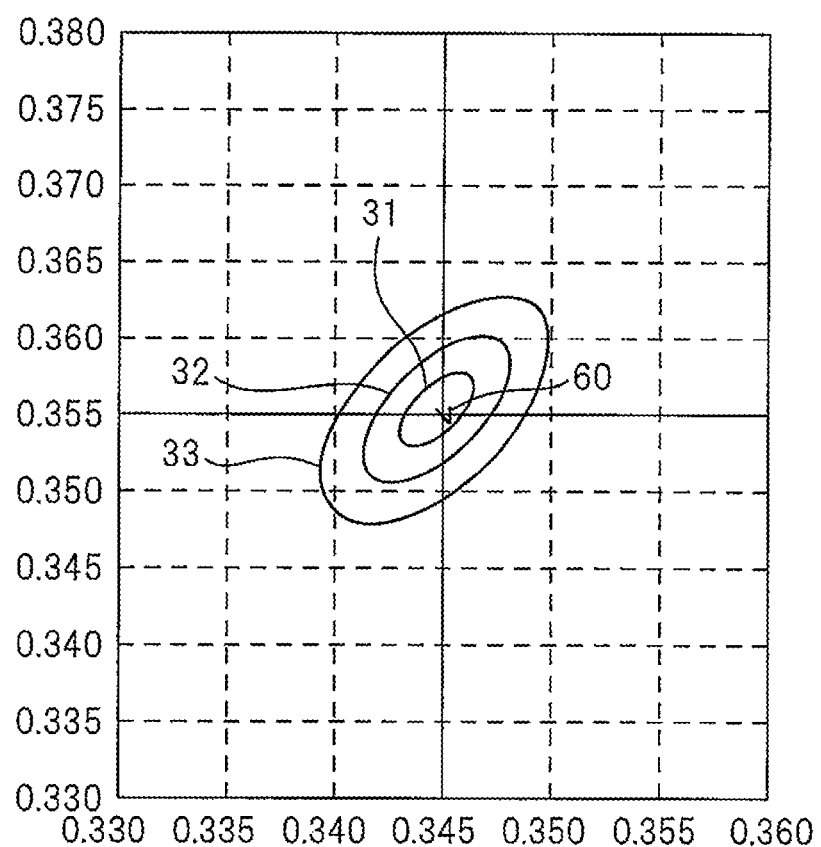
FIG. 8 is an xy chromaticity diagram showing the characteristic of the first embodiment.

FIG. 8 is an xy chromaticity diagram showing the characteristic of the first embodiment.

When the measured values shown in FIG. 7(c) are plotted in the xy chromaticity diagram, a locus 60 shown in FIG. 8 is obtained. As in FIG. 4, the small circle 31, the medium-sized circle 32, and the large circle 33 define the range of the 1-step MacAdam ellipse, the range of the 2-step MacAdam ellipse, and the range of the 3-step MacAdam ellipse, respectively.

As can be understood from FIG. 8, in the light-emitting device fabricated in the first embodiment, the temperature shift stays within the range of the 1-step MacAdam ellipse over the predetermined temperature range (25° C. to 85° C.);

it can therefore be considered that the possibility of the chromaticity being perceived as having changed is extremely small.

As described above, in the light-emitting device fabricated in the first embodiment, the first kind of LED chip that exhibits a temperature shift in the direction of arrow A (see FIG. 5) (Δx and Δy are both negative) is used in combination with the second kind of LED chip that exhibits a temperature shift in the direction of arrow B (see FIG. 5) (Δx and Δy are both positive). With this arrangement, the temperature shift can be made to stay within the range of the 1-step MacAdam ellipse over the predetermined temperature range (25° C. to 85° C.)

The LED chips that can be used in the light-emitting device 1 according to the present invention are not limited to the CL-L270-U1N-A-T and the CL-L400-C1N-A-T, respectively. In the light-emitting device 1 according to the present invention, LED chips in which Δx and Δy both become negative as the temperature rises and LED chips of the kind in which Δx and Δy both become positive as the temperature rises can be suitably combined for use. By thus combining two different types of LED chips, the change of chromaticity can be made to stay within the range of the 2-step MacAdam ellipse, and preferably within the range of the 1-step MacAdam ellipse, over the predetermined temperature range without using a special temperature compensation circuit.

In the light-emitting device 1 according to the present invention, since a plurality of kinds of LED chips are used in combination, it is preferable to use the diffusing plate 4 in order to mix the lights output from the plurality of kinds of LED chips. However, if the plurality of kinds of LED chips can be mounted sufficiently close to each other, the diffusing plate 4 may not be used.

While the types kinds of LED chips, each containing four LED chips, are used in the light-emitting device 1 according to the present invention, the number of LED chips need not be limited to four. Further, a plurality of kinds of LED chips in which Δx and Δy both become negative as the temperature rises may be used in combination with a plurality of kinds of LED chips in which Δx and Δy both are positive as the temperature rises.

FIG. 9 is a diagram for explaining the displacement that occurs on the xy chromaticity diagram due to a temperature rise.

FIG. 9(a) is a schematic diagram showing the condition in which the first kind of LED chip that exhibits a temperature shift in the direction of arrow A (see FIG. 5) (Δx and Δy are both negative) is at a normal temperature (for example, 25° C.). FIG. 9(b) is a schematic diagram showing the condition in which the first kind of LED chip shown in FIG. 9(a) is at a high temperature (for example, 60° C.). FIG. 9(c) is a schematic diagram showing the condition in which the second kind of LED chip that exhibits a temperature shift in the direction of arrow B (see FIG. 5) (Δx and Δy are both positive) is at a normal temperature (for example, 25° C.). FIG. 9(d) is a schematic diagram showing the condition in which the second kind of LED chip shown in FIG. 9(c) is at a high temperature (for example, 60° C.) It is to be noted that, in FIGS. 9(a) to 9(d), the displacement is exaggerated for illustrative purpose, compared with the displacement that actually occurs.

In the first kind of LED chip shown in FIGS. 9(a) and 9(b), the sealing resin 101 and the white resin frame 102 are chosen to have substantially the same thermal expansion coefficient, as in the earlier described CL-L270-U1N-A-T. Accordingly, when the temperature of the first kind of LED chip changes from the normal temperature (FIG. 9(a)) to the high temperature (FIG. 9(b)), the sealing resin 101 and the white resin frame 102 expand at approximately the same rate. Since phosphor particles 120 are dispersed substantially uniformly through the sealing resin 101, the concentration of the phosphor particles 120 in the sealing resin 101 becomes lower as the expansion progresses (FIG. 9(b)). Then, the proportion of the blue light C emitted from the LED die 100 and converted into yellow light by the phosphors 120 decreases, and the pseudo-white light emitted from the first kind of LED chip shifts toward blue, i.e., it shifts in the direction in which Δx and Δy both become negative.

In the second kind of LED chip shown in FIGS. 9(c) and 9(d), the white resin frame 202 is chosen to have a thermal expansion coefficient lower than that of the sealing resin 201, as in the earlier described CL-L400-C1N-A-T. Accordingly, when the temperature of the second kind of LED chip changes from the normal temperature (FIG. 9(c)) to the high temperature (FIG. 9(d)), the sealing resin 201 tries to expand, but the white resin frame 202 does not expand much. As a result, the sealing resin 201 expands so as to bulge out at its upper open end, and hence the optical path length along which the blue light D emitted from the LED die 200 travels through the second kind of LED chip increases (from $h_1$ to $h_2$) (FIG. 9(d)). Then, the proportion of the blue light D emitted from the LED die 200 and converted into yellow light by the phosphor particles 220 increases, and the pseudo-white light emitted from the second kind of LED chip shifts toward yellow, i.e., it shifts in the direction in which Δx and Δy both are positive.

As the temperature rises, the characteristics of the LED dies 100 and 200 more or less vary, and the characteristics of the phosphor particles also more or less vary, but the largest cause for the displacement that occurs on the xy chromaticity diagram due to a temperature rise is considered to be the difference in thermal expansion between the sealing resin and the resin frame, as described above. Accordingly, if the sealing resin and the resin frame are chosen to have substantially the same thermal expansion coefficient, the temperature shift tends to be directed in the direction of arrow A (FIG. 5) (Δx and Δy are both negative). On the other hand, if the thermal expansion coefficient of the resin frame is set lower than the thermal expansion coefficient of the sealing resin, the temperature shift tends to be directed in the direction of arrow B (FIG. 5) (Δx and Δy are both positive).

The preceding description only illustrates and describes exemplary embodiments of the present invention. It is not intended to be exhaustive or limit the invention to any precise form disclosed. It will be understood by those skilled in the art that various changes may be made and equivalent may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the claims. The invention may be practiced otherwise than is specifically explained and illustrated without departing from its spirit or scope.

DESCRIPTION OF THE REFERENCE NUMERALS

1 . . . LIGHT-EMITTING MODULE
2 . . . SUBSTRATE

4 . . . DIFFUSING PLATE
5 . . . PROTECTIVE COVER
11, 12, 13, 14 . . . FIRST KIND OF LED CHIP
21, 22, 23, 23 . . . SECOND KIND OF LED CHIP

What is claimed is:

1. A light-emitting device comprising:
a substrate;
a first LED chip which is arranged on said substrate, and which has a characteristic such that $\Delta x$ and $\Delta y$, each representing an amount of displacement on an xy chromaticity diagram, both are negative as temperature rises; and
a second LED chip which is arranged on said substrate, and which has a characteristic such that $\Delta x$ and $\Delta y$, each representing an amount of displacement on the xy chromaticity diagram, both are positive as temperature rises,
wherein the characteristic of said first LED chip and that of said second LED chip are set so that a temperature shift direction on the xy chromaticity diagram of said first LED chip and that of said second LED chip cancel out each other, whereby chromaticity of light emitted from said light-emitting device stays within a 2-step MacAdam ellipse despite changes over temperature range from 25° C. to 85° C. of said light-emitting device.

2. The light-emitting device according to claim 1, further comprising a current supply terminal for supplying current to said first LED chip and said second LED chip so that chromaticity of light emitted from said light-emitting device stays within the 2-step MacAdam ellipse despite changes in temperature of said light-emitting device.

3. The light-emitting device according to claim 1, further comprising a diffusing plate.

4. A method of chromaticity compensation in a light-emitting device having a substrate, comprising the steps of:
arranging on said substrate a first LED chip having a characteristic such that $\Delta x$ and $\Delta y$, each representing an amount of displacement on an xy chromaticity diagram, both are negative as temperature rises;
arranging on said substrate a second kind of LED chip having a characteristic such that $\Delta x$ and $\Delta y$, each representing an amount of displacement on an xy chromaticity diagram, both are positive as temperature rises, wherein slopes of $\Delta x$ and $\Delta y$ of said first LED chip are different from those of said second LED chip, and the characteristic of said first LED chip and that of said second LED chip are set so that a temperature shift direction on the xy chromaticity diagram of said first LED chip and that of said second LED chip cancel out each other when said first LED chip and said second LED chip change in temperature; and
supplying current to said first LED chip and said second LED chip so that chromaticity of light emitted from said light-emitting device stays within a 2-step MacAdam ellipse despite changes over temperature range from 25° C. to 85° C. of said light-emitting device even though the slopes of the $\Delta x$ and $\Delta y$ of said first LED chip are different from those of said second LED chip.

* * * * *